(12) United States Patent
Torigoe

(10) Patent No.: US 7,812,289 B2
(45) Date of Patent: Oct. 12, 2010

(54) CERAMIC HEATER

(75) Inventor: Takeru Torigoe, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 490 days.

(21) Appl. No.: 11/950,546

(22) Filed: Dec. 5, 2007

(65) Prior Publication Data

US 2008/0142506 A1    Jun. 19, 2008

(30) Foreign Application Priority Data

Dec. 15, 2006  (JP)  ............................. 2006-338467
Nov. 28, 2007  (JP)  ............................. 2007-307621

(51) Int. Cl.
*H05B 3/68* (2006.01)
*H01C 1/012* (2006.01)

(52) U.S. Cl. .............. 219/466.1; 219/468.1; 219/444.1; 219/445.1; 219/543; 219/544; 219/546; 219/547; 219/548; 219/542; 338/308; 338/306; 338/307; 338/309; 338/310

(58) Field of Classification Search .............. 219/466.1, 219/468.1, 444.1, 445.1, 543, 544, 546, 547, 219/548, 542; 338/306–310, 312
See application file for complete search history.

(56) References Cited

FOREIGN PATENT DOCUMENTS

JP    04-101380 A1    4/1992

*Primary Examiner*—Shawntina Fuqua
(74) *Attorney, Agent, or Firm*—Burr & Brown

(57) ABSTRACT

A ceramic heater according to the present invention includes a heating portion made of ceramics, and a cooling plate portion. In the heating portion, a belt like printed electrode is formed continuously in a spiral shape along a circumferential direction, and in the printed electrode, slits extended in a width direction of the printed electrode are provided. In such a way, a ceramic heater in which uniform heating performance in the heating surface is high can be obtained.

3 Claims, 8 Drawing Sheets

CERAMIC HEATER

CROSS REFERENCE TO RELATED APPLICATIONS

This application is based upon and claims the benefit of priority from prior Japanese Patent Application 2006-338467, filed on Dec. 15, 2006, and 2007-307621, filed on Nov. 28, 2007; the entire contents of which are incorporated herein by reference.

BACKGROUND OF THE INVENTION

1. Field of the Invention

The present invention relates to a ceramic heater applied to a semiconductor manufacturing apparatus such as a CVD apparatus and an etching apparatus.

2. Description of the Related Art

In the field of the semiconductor manufacturing technology, it is frequent that processing such as plasma etching, chemical vapor deposition (CVD) and ion plating is implemented for a wafer and the like. In the case of implementing such processing, a ceramic heater or the like is used as a device that heats the wafer. The ceramic heater includes a heating portion that mounts thereon and heats the wafer and the like (for example, refer to Japanese Patent Laid-Open Publication No. H4-101380 (published in 1992)).

In the heating portion described in this publication, a printed electrode (film-like resistance heating body) that generates heat by being applied with a voltage is provided.

Here, a description will be briefly made of a manufacturing method of the heating portion of the ceramic heater to which the printed electrode is applied. A resistance heating body paste layer is formed on an upper surface of a temporarily fired body or sintered body of ceramics, the resistance heating body paste layer is embedded with ceramic powder from the above, and the ceramic powder is compressed and molded, whereby a molded body is fabricated. Then, hot press firing is implemented for the molded body, whereby the heating portion is obtained.

SUMMARY OF THE INVENTION

However, in the above-described ceramic heater, when such a belt-like printed electrode is formed continuously in a spiral shape along a circumferential direction, it is considered that a current flows concentratedly or an inner circumferential side in a width of the printed electrode. Then, a generation amount of heat generated in the printed electrode is also increased on the inner circumferential side in a width direction than on an outer circumferential side therein, and there is an apprehension that variations may occur in a heat generation density on an electrode-formed surface on which the printed electrode is formed, causing a decrease of uniform heating performance on the electrode-formed surface. It causes a decrease of uniform heating performance in a heating surface of the heating portion. The inferior heating performance causes an apprehension that a quality loss of a processing target such as the wafer may be brought.

It is an object of the present invention to provide a ceramic heater in which the uniform heating performance is excellent in the heating surface.

In order to achieve the above-described object, a ceramic heater according to the present invention includes: a heating portion made of ceramics; a belt-like printed electrode formed in the heating portion, the belt-like printed electrode formed continuously in a spiral shape along a circumferential direction of the heating portion; and slits extended from an inner circumferential side of the heating portion toward an outer circumferential side thereof in a width direction of the printed electrode, wherein the slits are provided in bent portions where the electrode bends at a protrusion shape toward an outer circumferential side.

In the ceramic heater according to the present invention, the slits extended from the inner circumferential side of the heating portion toward the outer circumferential side thereof are formed in the bent portions of the printed electrode in the width direction of the printed electrode. Hence, the current flows uniformly in any regions in the width direction of the printed electrode, and accordingly, a current density is uniformed in the width direction. In such a way, the uniform heating performance on the electrode formed surface is enhanced, and the uniform heating performance in the heating surface formed on the heating portion of the ceramic heater is also enhanced. As the uniform heating performance in the heating surface is being enhanced, a quality loss is prevented in the processing target such as the wafer.

DETAILED DESCRIPTION OF THE EMBODIMENTS

A description will be made of an embodiment of the present invention with reference to the drawings.

Figure 1:
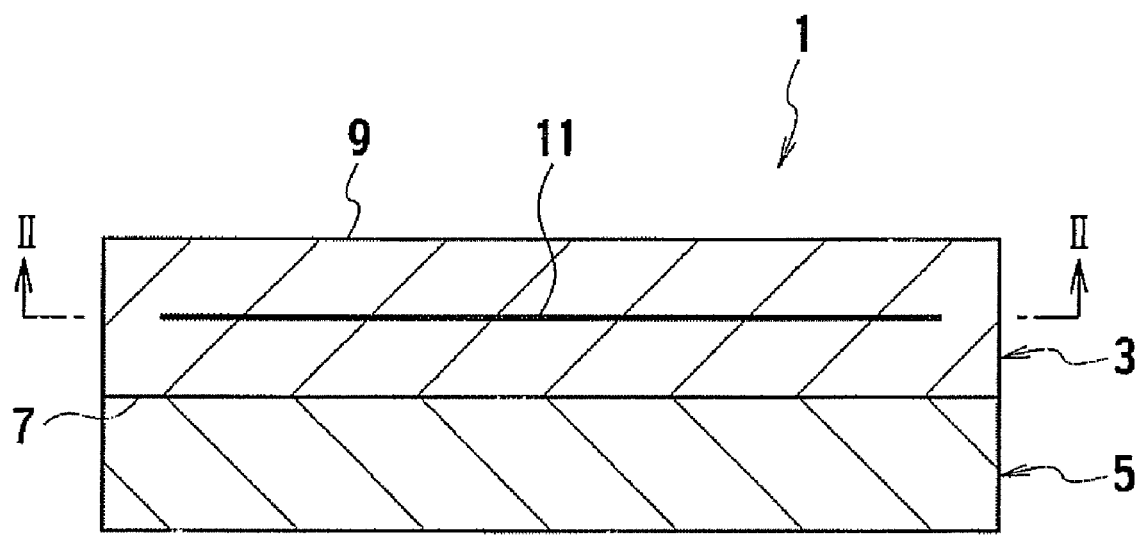
FIG. 1 is a cross-sectional view schematically showing a ceramic heater according to an embodiment of the present invention.

FIG. 1 is a cross-sectional view schematically showing a ceramic heater according to the embodiment of the present invention.

In this ceramic heater 1, a heating portion 3 disposed on an upper side and a cooling plate portion 5 disposed on a lower side are bonded to each other while interposing a bonding sheet 7 therebetween. Moreover, an upper surface of the heating portion 3 is formed into a heating surface 9 on which a processing target such as a wafer is mounted and heated. Moreover, in an inside of the heating portion 3, a printed electrode 11 is embedded.

Figure 2:
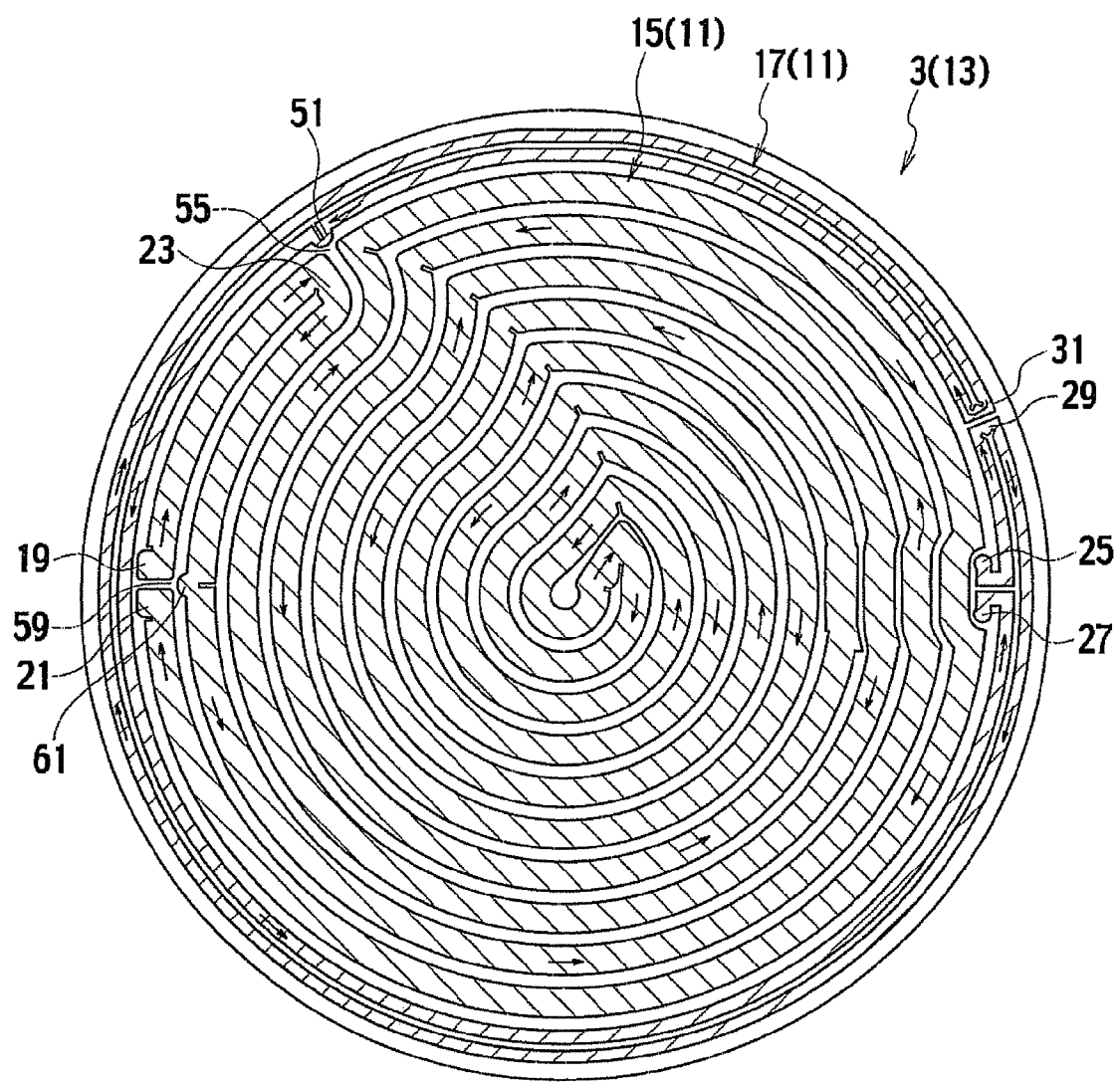
FIG. 2 is a cross-sectional view taken along a line II-II of FIG. 1, showing ah entirety of an electrode-formed surface.
Figure 3:
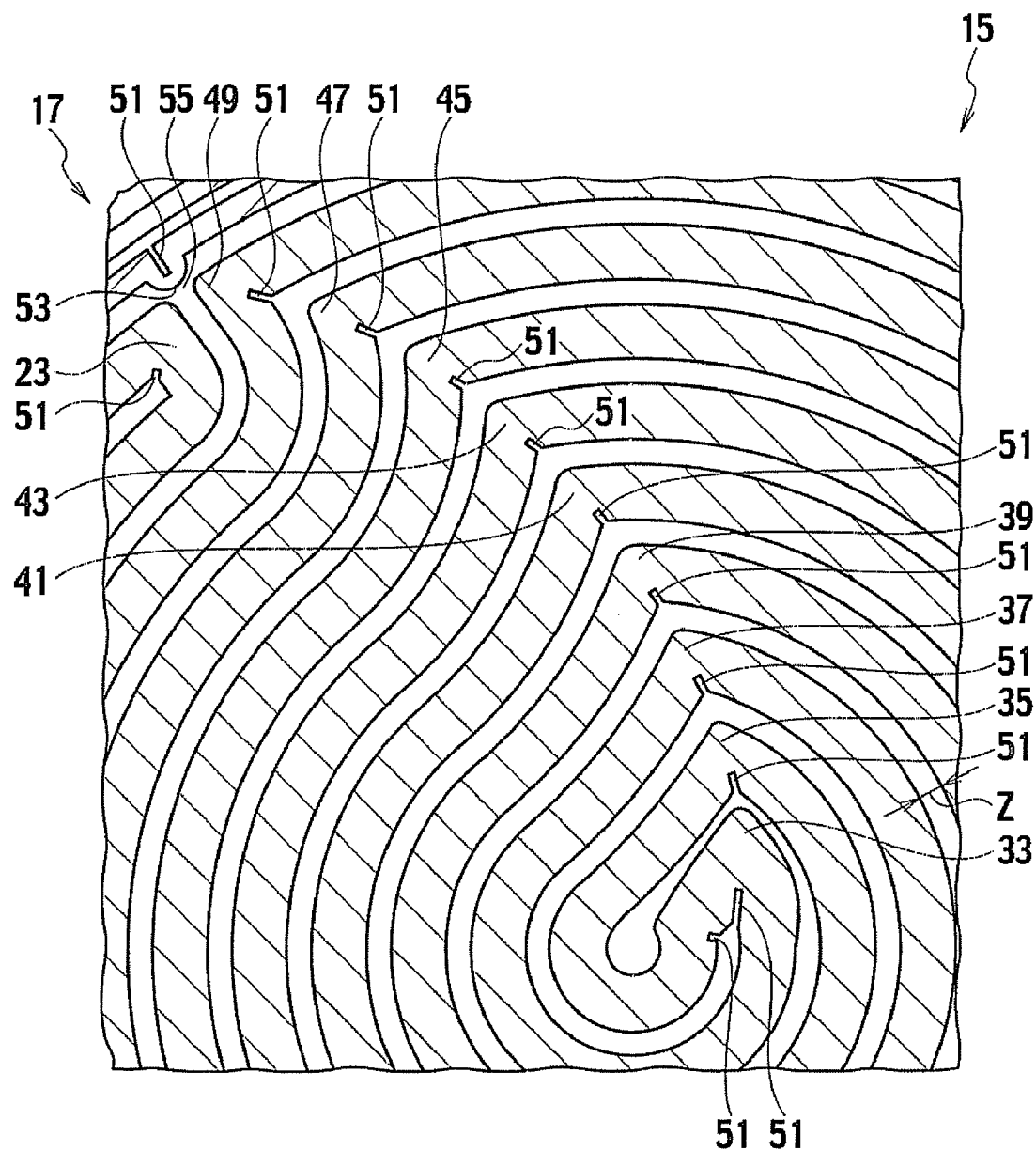
FIG. 3 is a cross-sectional view in which a part of FIG. 2 is enlarged.

FIG. 2 is a cross-sectional view taken along a line II-II of FIG. 1. Moreover, FIG. 3 is a cross-sectional view in which a part of FIG. 2 is enlarged.

As shown in FIG. 2, the printed electrode 11 formed on an electrode formed surface 13 is composed of a wide inner electrode 15 disposed on an inner circumferential side, and a narrow outer electrode 17 disposed on an outer circumferential side of the inner electrode 15. One end 19 of the inner electrode 15 and the other end 21 thereof are formed as shown in a left end portion of FIG. 2, and are arranged close to each other.

The inner electrode 15 is extended obliquely right upward in FIG. 2 along a clockwise direction from the one end 19, turns back at a turning portion 23 on the way, and is extended along a counterclockwise direction. Then, the inner electrode 15 is extended continuously in a spiral shape along a circumferential direction, turns back again in a vicinity of a center portion of the inner electrode 15, is extended along the clockwise direction, and reaches the other end 21.

The outer electrode 17 is a narrower electrode than the inner electrode 15. In the outer electrode 17, one end 25 and the other end 27 are arranged close to each other. The outer electrode 17 is extended from the one end 25 counterclockwise along the circumferential direction, turns back on the way, and is extended while making one round from a turning portion 29 clockwise along the circumferential direction. Then, the outer electrode 17 turns back again at another turning portion 31, is extended while making one round along the circumferential direction, and reaches the other end 27 described above.

FIG. 3 shows the printed electrode 11 in which slits are formed in a plurality of spots.

In the inner electrode 15, a plurality of bent portions are formed where the electrode bends at a protrusion shape from an inside toward an outside in the diameter direction (that is, from the inner circumferential side toward the outer circumferential side). These bent portions are regions in which the printed electrode is bent substantially at a right angle.

The above-described bent portions include a first bent portion 33, a second bent portion 35, a third bent portion 37, a fourth bent portion 39, a fifth bent portion 41, a sixth bent portion 43, a seventh bent portion 45, an eighth bent portion 47, and a ninth bent portion 49. In the respective bent portions, slits 51 are individually formed from the inner circumferential side toward the outer circumferential side.

The printed electrode 11 is formed continuously in a spiral shape along the circumferential direction. Here, when the slits 51 are not formed, a current is prone to flow in a biased manner along the inner circumferential side of the printed electrode 11 in the width direction thereof, and a current density on the inner circumferential side is increased. Then, a heat generation density on the inner circumferential side becomes larger than that on the outer circumferential side.

However, in accordance with this embodiment, the slits 51 extended from the inner circumferential side of the printed electrode 11 toward the outer circumferential side thereof are formed, and accordingly, the current density in the width direction of the printed electrode 11 can be uniformed, and the heat generation density can also be uniformed.

Moreover, as shown on upper left of FIG. 3, a part of the outer electrode 17 is protruded, whereby a protrusion portion 53 is formed. As described above, on the outermost circumferential side of the inner electrode 15, the turning portion 23 is formed. A region surrounded by the turning portion 23, the ninth bent portion 49 of the inner electrode 15, and the outer electrode 17 becomes a low density portion 55 where a density of the printed electrode 11 is low. Hence, the protrusion portion 53 of the outer electrode 17 is protruded toward the low-density portion 55 (that is, toward the inner circumferential side). In the protrusion portion 53 of the outer electrode 17, another slit 51 is formed from the outer circumferential side toward the inner circumferential side.

Here, the low density portion 55 is a region where an interval between the inner electrode 15 and outer electrode 17 is large, and the heat generation density of the low-density portion 55 is low. Hence, the protrusion portion 53 is formed so as to be protruded toward the low-density portion 55, whereby a temperature of the generated heat in the low-density portion 55 is prevented from falling down, thus making it possible to keep uniform heating performance on the electrode-formed surface 13 in excellent condition.

Note that, also in the above-described inner electrode 15 of FIG. 2, as shown in the left end portion of FIG. 2, another low-density portion 59 is formed in a region among the one end 19 of the inner electrode 15, the other end 21 thereof, and the inner electrode 15 disposed adjacent to inner circumferential sides of the one end 19 and the other end 21. Moreover, a protrusion portion 61 formed by protruding a part of the inner electrode 15 is formed toward the low-density portion 59.

Figure 4:
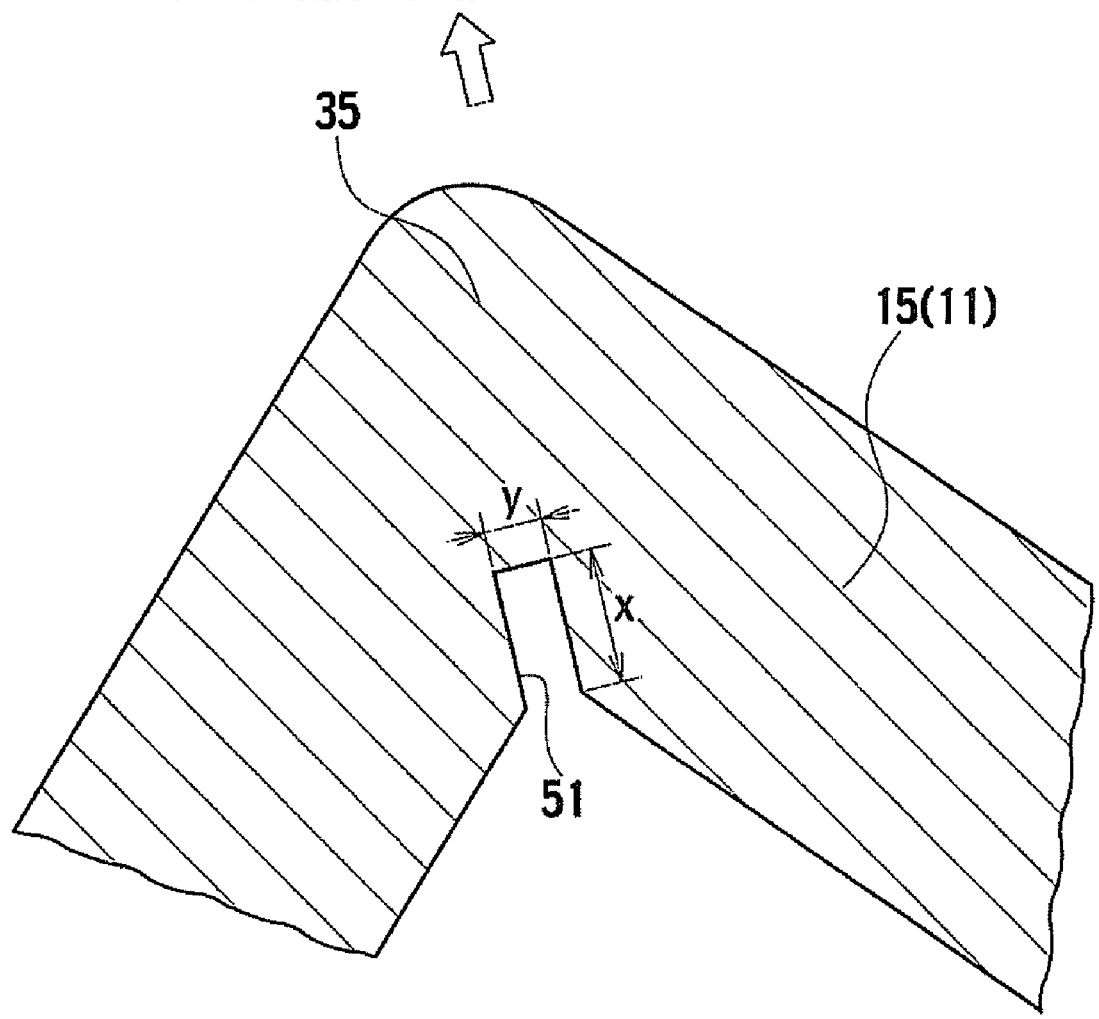
FIG. 4 is a plan view in which a slit vicinity portion in a second bent portion is enlarged.

FIG. 4 is a plane view in which a slit vicinity portion in the second bent portion is enlarged.

As shown in FIG. 4, in an inside in the diameter direction of the second bent portion 35, the substantially rectangular slit 51 extended thinly toward the outer circumferential side is formed. A length along a longitudinal direction of the slit 51 is defined as x, and a width of the slit 51 is defined as y. Moreover, as shown in FIG. 3, when an interval between the printed electrodes adjacent to each other is defined as z, $\Delta T$ is obtained by the following Expression 1 Selection is performed for x, y and z so that $\Delta T$ can become less than 2° C.

$$\Delta T = (-0.06y - 0.773)x - 0.24y + 0.424z + 1.522 \quad \text{(Expression 1)}$$

Moreover, an area ratio S is defined by the following Expression 2.

$$S = (0.082z + 2.5839)\Delta T^2 + (-1.6817z - 0.0561)\Delta T + (1.4788z - 1.6119) \quad \text{(Expression 2)}$$

Here, values of x, y and z, at which $\Delta T$ becomes less than 2° C., and a value of $\Delta T$ are substituted into Expression 2, and the area ratio S is calculated. Then, x, y and z are set so that the calculated area ratio S can be 5% or less, whereby the uniform heating performance of the electrode-formed surface 13 and the heating surface 9 can be significantly improved.

A description will be briefly made below of a manufacturing method of the ceramic heater according to this embodiment.

First, an electrode continuous in the spiral shape along the circumferential direction is printed on a surface (electrode-formed surface 13) of a disc-like temporarily fired body or sintered body made of ceramics, whereby the printed electrode 11 is formed on the electrode-formed surface 13. Then, the temporarily fired body or the sintered body, on which the printed electrode 11 is formed, is filled with ceramic powder from the above, and the ceramic powder is compressed and molded, whereby a molded body is fabricated. Subsequently, hot press firing is implemented for the molded body, and predetermined machining is implemented therefor, power terminals are connected to the embedded electrodes through bores in the sintered ceramic body, whereby the heating portion 3 is obtained.

Meanwhile, the cooling plate portion 5 is made of, for example, metal such as aluminum, and forms a cooling passage and an introduction port in an inside thereof.

Then, when the heating portion 3 and the cooling plate portion 5 are bonded to each other while interposing the bonding sheet 7 therebetween, the ceramic heater 1 according to the present invention is completed.

EXAMPLES

A description will be specifically made of the present invention through examples.

Example 1

In Example 1, the uniform heating performance of the heating surface 9 of the heating portion 3 in the inside of which the printed electrode 11 is provided was confirmed by using a ceramic heater 1 having a similar structure to that in FIG. 1.

The heating portion 3 in the ceramic heater 1 is made of alumina, and on the electrode-formed surface 13, the printed electrode 11 is formed. Note that the heating portion 3 was fabricated by the same manufacturing method as the method described in DETAILED DESCRIPTION OF THE EMBODIMENTS.

The ceramic heater 1 was formed into a substantial disc shape, an outer diameter thereof was set at 300 mm, and a thickness thereof was set at 6 mm. The printed electrode 11 was formed into the shape shown in FIG. 2. A distance between the printed electrode 11 and the heating surface 9 was set at 3.5 mm.

Figure 5:
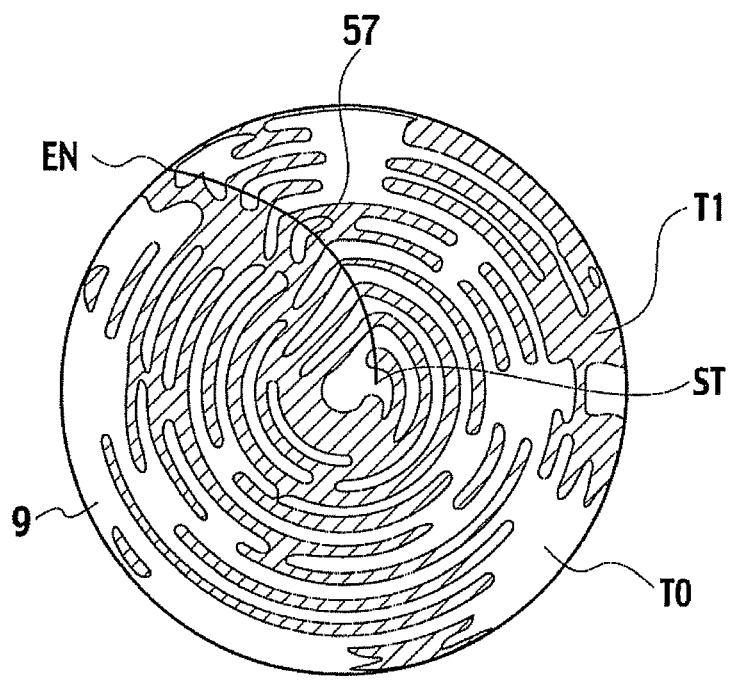
FIG. 5 is a schematic view showing a temperature distribution on a heating surface of a present invention example in which slits are formed in a printed electrode in Example 1.
Figure 6:
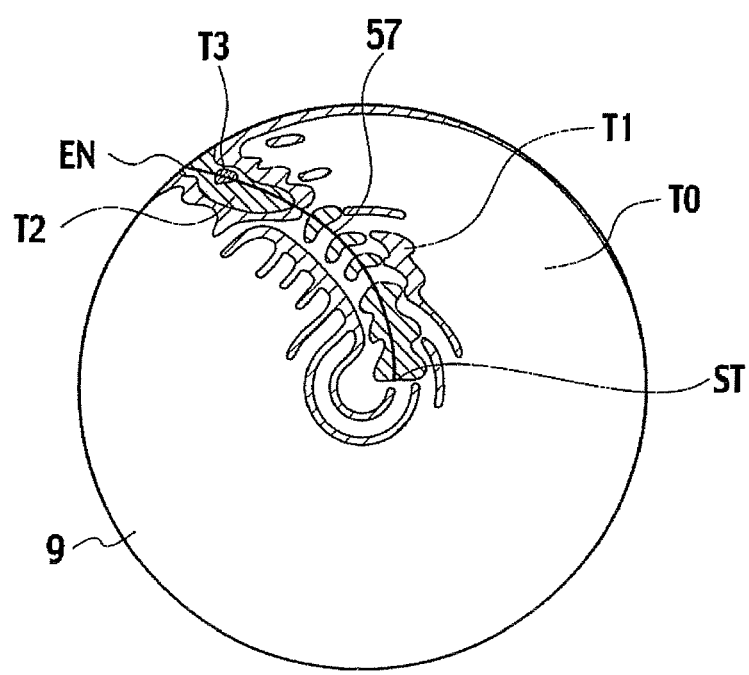
FIG. 6 is a schematic view showing a temperature distribution on a heating surface of a comparative example in which the slits are not formed in the printed electrode in Example 1.

Electric power of 2950 W was supplied through power terminals to the printed electrode 11 of the above-described ceramic heater 1. Specifically, electric power of 2380 W was supplied to the inner electrode 15, and electric power of 590 W was supplied to the outer electrode 17. In this state, as shown in FIG. 5 and FIG. 6, a heat generation amount on the heating surface 9 was measured by using an infrared camera. FIG. 5 shows a heat generation distribution on the heating surface 9 according to the present invention. The slits are formed in the printed electrode. Meanwhile, FIG. 6 shows a heat generation distribution according to a comparative example, in which the slits are not formed in the printed electrode.

In FIG. 5, a temperature of a hatched portion T1 was lower by approximately 1.1° C. than a temperature of a white portion T0. In FIG. 6, a temperature of the hatched portion T1 was lower by approximately 1.1° C. than the temperature of the white portion T0, a temperature of a hatched portion T2 was lower by approximately 3.2° C. than the temperature of the white portion T0, and a temperature of a hatched portion T3 was lower by approximately 5.4° C. than the temperature of the white portion T0.

Figure 7:
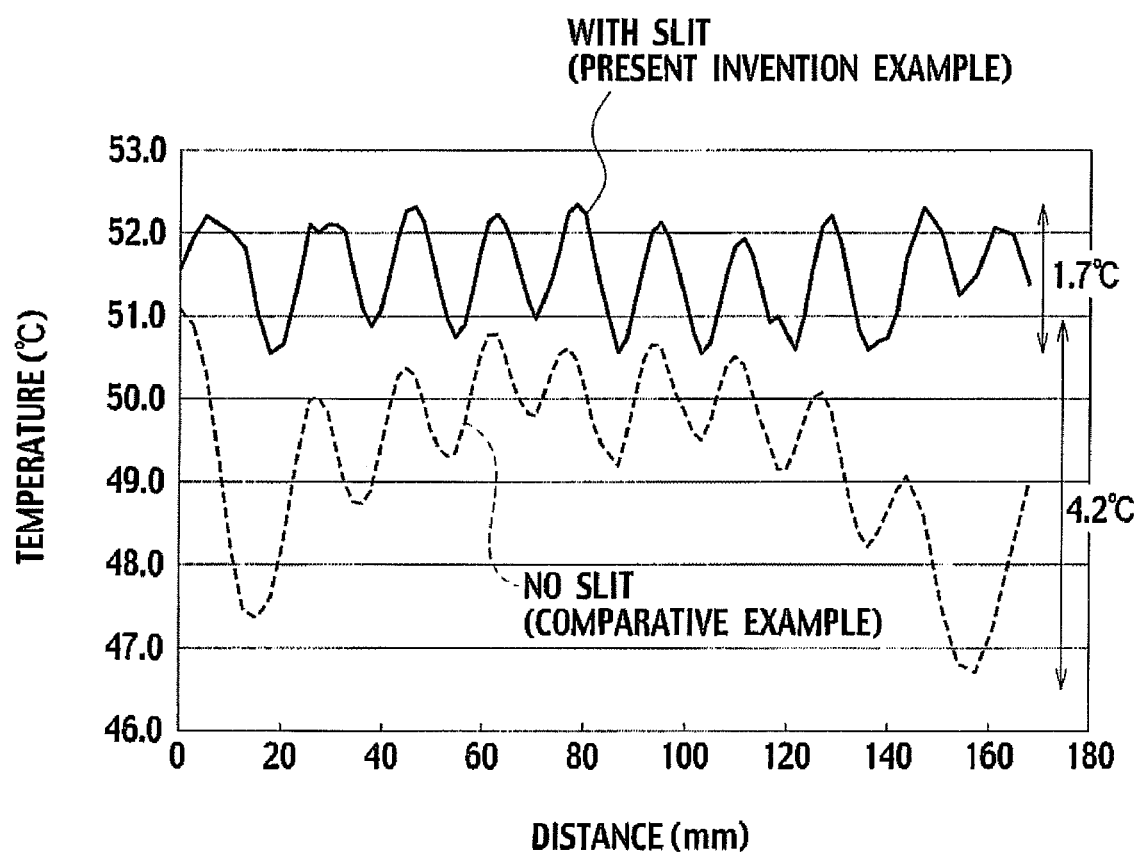
FIG. 7 is a graph showing temperature measurement results FIG. 5 and FIG. 6 in Example 1.

A graph in FIG. 7 shows partial temperature distributions of FIG. 5 and FIG. 6. Specifically, as shown in FIGS. 5 and 6, heating temperatures were measured along temperature measurement regions 57, each of which starts from a temperature-measurement starting portion ST in a vicinity of a center portion of the heating surface 9, passes through a region of the heating surface 9, the region corresponding to the bent portions (refer to FIG. 2) of the printed electrode, and reaches a temperature-measurement ending portion EN in a region of the heating surface 9, the region corresponding to an outer circumferential edge of the electrode-formed surface 13.

As shown in FIG. 7, in a present invention example (corresponding to FIG. 5) shown by a solid line, a temperature difference between the maximum and minimum values of the temperature of the generated heat in the entirety of the heating surface 9 was 1.7° C. In the comparative example (corresponding to FIG. 6) shown by a dotted line, temperature difference was 4.2° C. As described above, it turned out that, in the present invention example in which the slits are formed in the printed electrode, the uniform heating performance of the entirety of the heating surface 9 is significantly improved in terms of the temperature of the generated heat more than in the comparative example in which the slits are not formed.

Example 2

Subsequently, the temperatures of the generated heat when the electrode interval z was set at 4 mm, and the length x and width y of the slits were set at values shown in the following Table 1 were measured. With regard to a size of the ceramic heaters 1, the outer diameter thereof was set as 141 mm, and the thickness thereof was set at 6 mm. Note that the heating portions 3 are made of alumina in a similar way to Example 1, and a manufacturing method of the ceramic heaters 1 was set the same as that of Example 1.

TABLE 1

|  | Electrode width [mm] | Electrode interval [mm] (Z) | Slit width [mm] (Y) | Silt length [mm] (X) | Temperature difference between set temperature and lowest temperature [° C.] | Out-of-range area ratio [%] |
| --- | --- | --- | --- | --- | --- | --- |
| Present invention example 1 | 9.2 | 4.0 | 0.5 | 1.5 | 1.9 | 1.9 |
| Present invention example 2 |  |  |  | 2.0 | 1.5 | 0.7 |
| Present invention example 3 |  |  |  | 2.5 | 1.1 | 0.4 |
| Present invention example 4 |  |  |  | 3.0 | 0.7 | 1.0 |
| Present invention example 5 |  |  | 1.0 | 1.0 | 2.1 | 3.1 |

TABLE 1-continued

| | Electrode width [mm] | Electrode interval [mm] (Z) | Slit width [mm] (Y) | Slit length [mm] (X) | Temperature difference between set temperature and lowest temperature [° C.] | Out-of-range area ratio [%] |
|---|---|---|---|---|---|---|
| Present invention example 6 | | | | 1.5 | 1.7 | 1.3 |
| Present invention example 7 | | | | 2.0 | 1.3 | 0.4 |
| Present invention example 8 | | | | 2.5 | 0.9 | 0.6 |
| Present invention example 9 | | | 1.5 | 1.0 | 2.0 | 2.4 |
| Present invention example 10 | | | | 1.5 | 1.6 | 0.8 |
| Present invention example 11 | | | | 2.0 | 1.1 | 0.4 |
| Present invention example 12 | | | | 2.5 | 0.7 | 1.0 |
| Present invention example 13 | | | 2.0 | 0.5 | 2.3 | 4.0 |
| Present invention example 14 | | | | 1.0 | 1.8 | 1.7 |
| Present invention example 15 | | | | 1.5 | 1.4 | 0.5 |
| Present invention example 16 | | | | 2.0 | 1.0 | 0.5 |
| Present invention example 17 | | | 3.0 | 0.5 | 2.0 | 2.5 |
| Present invention example 18 | | | | 1.0 | 1.5 | 0.8 |
| Present invention example 19 | | | | 1.5 | 1.1 | 0.4 |
| Present invention example 20 | | | | 2.0 | 0.6 | 1.3 |
| Comparative example 1 | | | 0.0 | 0.0 | 3.2 | 12.6 |

Electric power of 897.8 W was supplied to each of the printed electrodes 11, and the temperature of the generated heat on each of the heating surfaces 9 was measured. The supplied electric power of 897.8 W in Example 2 has a heat generation density equivalent to the supplied electric power of 3 kW in the ceramic heater 1 with an outer diameter of 300 mm in Example 1.

Figure 8:
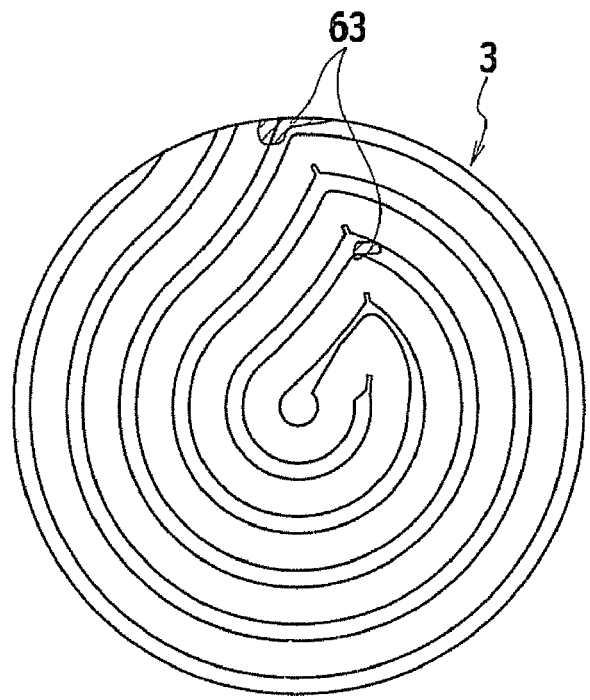
FIG. 8 is a schematic view showing a temperature distribution on a heating surface of Present invention example 7 in Example 2.

FIG. 8 is a schematic view showing a temperature distribution on the heating surface 9 of Present invention example 7 in Table 1. The substantial entirety of the heating surface 9 is heated to a temperature of 45° C. as a set temperature Then, two regions 63 at 42° C. as the lowest, temperature were observed on an upper portion of FIG. 8. Here, a difference between the set temperature and the lowest temperature is 3° C., which is larger than 2° C. An area of the regions 63 at 42° C. was 62.5 mm². Hence, an out-of-range area ratio of the regions (that is, an area ratio of the out-of-range regions) where the temperature difference between the set temperature and the lowest temperature becomes larger than 2° C. became 0.4%.

A description will be briefly made of a calculation method of the out-of-range area ratio. The heating surface 9 and the electrode-formed surface 13 are formed to have the same area. First, the entire area of the heating surface 9 becomes $\pi \times (141/2)^2 = 15607$ mm². Meanwhile, the area of the regions 63 where the temperature of the generated heat is 42° C. (lowest temperature) is 62.5 mm². Hence, as shown in Table 1, the out-of-range area ratio is calculated to be nearly equal to $0.4\% \approx (62.5/15607) \times 100$.

Figure 9:
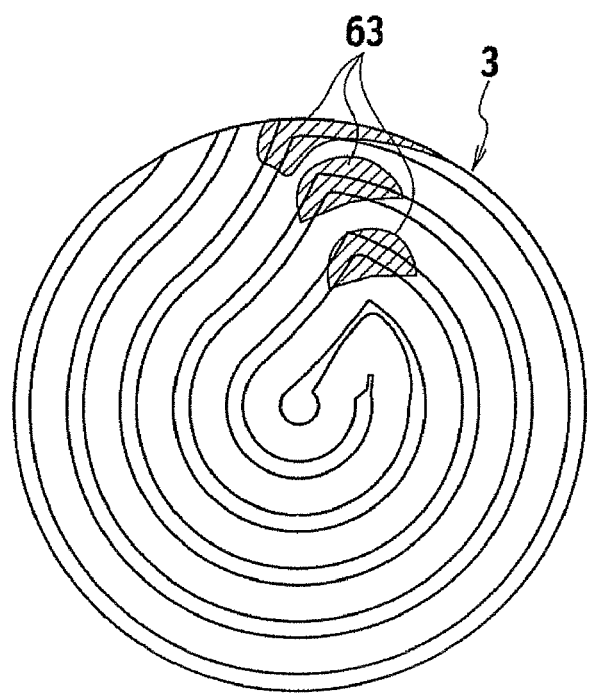
FIG. 9 is a schematic view showing a temperature distribution on a heating surface of Comparative example 1 in Example 2.

Moreover, FIG. 9 shows a temperature distribution on the heating surface 9 of Comparative example 1 in Table 1. In Comparative example 1, the slits were not formed in the printed electrode 11. Three spots as the regions 63 at 42° C. that is the lowest temperature were observed on the heating surface 9. An area (total area of the regions 63) of the regions where the temperature difference between the set temperature and the lowest temperature is larger than 2° C. was 1967 mm². Hence, as shown in Table 1, the out-of-range area ratio becomes equal to $12.6\% = (1967/15607) \times 100$. Calculation methods of the other out-of-range area ratios were also set similarly.

As shown in Table 1, it turned out, when the electrode interval z is 4 mm, the out-of-range area ratios of Present, invention examples 1 to 20 are significantly lower than the out-of-range area ratio of Comparative example 1.

Example 3

Subsequently, the temperatures of the generated heat when the electrode interval z was set at 1.5 mm, and the length x and width y of the slits 51 were set at values shown in the following Table 2 were measured. With regard to the size of the ceramic heaters 1, the outer diameter thereof was set as 117 mm, and the thickness thereof was set at 6 mm. The heating portions 3 are made of alumina in a similar way to Examples 1 and 2, and a manufacturing method of the ceramic heaters 1 was set the same as those of Example 1 and Example 2.

TABLE 2

| | Electrode width [mm] | Electrode interval [mm] (Z) | Slit width [mm] (Y) | Slit length [mm] (X) | Temperature difference between set temperature and lowest temperature [°C] | Out-of-range area ratio [%] |
|---|---|---|---|---|---|---|
| Present invention example 21 | 9.2 | 1.5 | 0.5 | 1.0 | 1.2 | 1.5 |
| Present invention example 22 | | | | 1.5 | 0.8 | 0.3 |
| Present invention example 23 | | | | 2.0 | 0.4 | 0.0 |
| Present invention example 24 | | | | 2.5 | 0.0 | 0.5 |
| Present invention example 25 | | | 1.0 | 1.0 | 1.1 | 1.0 |
| Present invention example 26 | | | | 1.5 | 0.7 | 0.1 |
| Present invention example 27 | | | | 2.0 | 0.3 | 0.1 |
| Present invention example 28 | | | | 2.5 | −0.2 | 1.1 |
| Present invention example 29 | | | 1.5 | 0.5 | 1.4 | 2.1 |
| Present invention example 30 | | | | 1.0 | 0.9 | 0.6 |
| Present invention example 31 | | | | 1.5 | 0.5 | 0.0 |
| Present invention example 32 | | | | 2.0 | 0.1 | 0.4 |
| Present invention example 33 | | | 2.0 | 0.5 | 1.2 | 1.5 |
| Present invention example 34 | | | | 1.0 | 0.8 | 0.2 |
| Present invention example 35 | | | | 1.5 | 0.3 | 0.0 |
| Present invention example 36 | | | | 2.0 | −0.1 | 0.9 |
| Present invention example 37 | | | 3.0 | 0.5 | 1.0 | 0.6 |
| Present invention example 38 | | | | 1.0 | 0.5 | 0.0 |
| Present invention example 39 | | | | 1.5 | 0.0 | 0.6 |
| Comparative example 2 | | | 0.0 | 0.0 | 2.2 | 7.6 |

Electric power of 602.2 W was supplied to each of the printed electrodes 11, and the temperature of the generated heat on each of the heating surfaces 9 was measured. The supplied electric power of 602.2 W in Example 3 has a heat generation density equivalent to the supplied electric power of 3 kW in the ceramic heater 1 with an outer diameter of 300 mm in Example 1.

Figure 10:
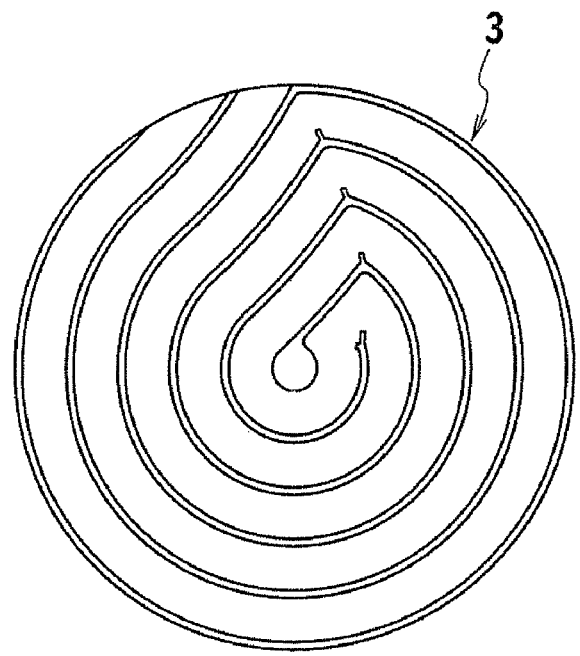
FIG. 10 is a schematic view showing a temperature distribution on a heating surface of Present invention example 25 in Example 3.

FIG. 10 is a schematic view of the heating surface 9, showing a temperature distribution in Present invention example 23 in Table 2. The heat was generated to the temperature of 45° C. as the set temperature over the substantial entirety of the heating surface 9. Moreover, the lowest temperature was 44.6° C. lower by 0.4° C. than 45° C. as the set temperature. Hence, the out-of-range area ratio of the regions where the temperature difference between the set temperature and the lowest temperature becomes larger than 2° C. became 0%.

Figure 11:
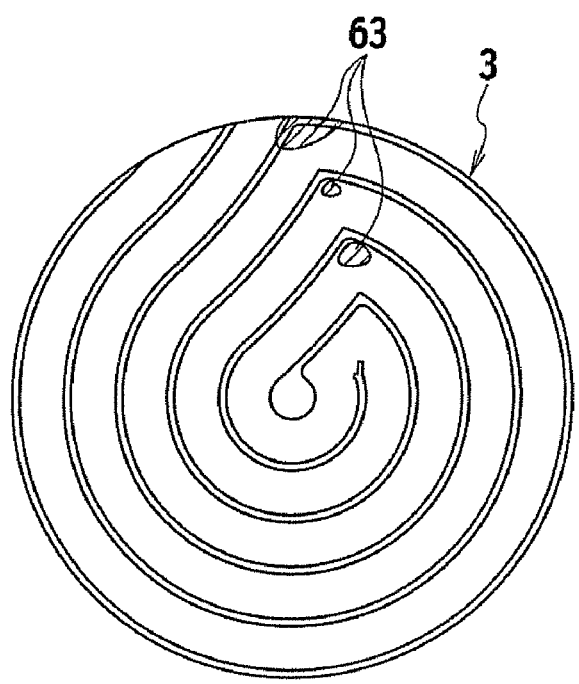
FIG. 11 is a schematic view showing a temperature distribution on a heating surface of Comparative example 2 in Example 3.

FIG. 11 is a schematic view of the heating surface 9, showing a temperature distribution in Comparative example 2 in Table 2. In Comparative example 2, the slits were not formed in the printed electrode 11. Three spots as the regions 63 at 42° C. that is the lowest temperature were observed on the heating surface 9. An area (total area of the regions 63) of the regions where the temperature difference between the set temperature and the lowest temperature is larger than 2° C. was 817 mm². The out-of-range area ratio became 7.6%.

As shown in Table 2, the out-of-range area ratios in Present invention examples 21 to 39 became significantly lower values than the out-of-range area ratio in Comparative example 2.

Subsequently, a description will be made of Expression 1 and Expression 2, which are shown in the above-described embodiment. Expression 1 and Expression 2 will be inserted below one more time.

$$\Delta T = (-0.06y - 0.773)x - 0.24y + 0.424z + 1.522 \quad \text{(Expression 1)}$$

$$S = (0.082z + 2.5839)\Delta T^2 + (-1.6817z - 0.0561)\Delta T + (1.4788z - 1.6119) \quad \text{(Expression 2)}$$

Values of x, y and z, which are written on the above-described Table 1 and Table 2, were substituted into Expression 1, and values of $\Delta T$ were obtained. Then, values of x, y and z, at which the values of $\Delta T$ become less than 2° C., were selected. Then, the selected values of x, y and z and the obtained values of $\Delta T$ were substituted into Expression 2. In such a way, the area ratios S were obtained. With regard to all of Present invention examples 1 to 39, the area ratios S thereof became 5% or less, and it turned out that good uniform heating performance is inherent, therein. An example will be specifically shown.

In Present invention example 20, the above described values are: $x=2.0$; $y=3.0$; and $z=4.0$. The value of $\Delta T$, which was calculated by using Expression 1, became nearly equal to 0.592. This value 0.592 is less than 2. Therefore, the area ratio S was obtained by using Expression 2, and then the value of S became nearly equal to 1.31 (5% or less). As described above, in Present invention example 20, the value of $\Delta T$ became less than 2° C., and the value of area ratio S became 5% or less.

What is claimed is:

1. A ceramic heater, comprising:
a heating portion made of ceramics;
a belt-like printed electrode formed in the heating portion, the belt-like printed electrode formed continuously in a spiral shape along a circumferential direction of the heating portion; and
slits extended from an inner circumferential side of the heating portion toward an outer circumferential side thereof in a width direction of the printed electrode,
wherein the slits are provided in bent portions where the electrode bends at a protrusion shape toward an outer circumferential side.

2. A ceramic heater, comprising:
a heating portion made of ceramics;
a belt-like printed electrode formed in the heating portion, the belt-like printed electrode formed continuously in a spiral shape along a circumferential direction of the heating portion; and
slits extended in a width direction of the printed electrode,
wherein the printed electrode is formed to be protruded toward a low-density portion in which a printed density of the printed electrode is low, and the slit, is provided in a formed protrusion portion toward the low-density portion.

3. The ceramic heater according to claim 1, wherein, when a length of the slits is defined as x, a width of the slits is defined as y, and an interval between the printed electrodes adjacent to each other is defined as z, x, y and z, at which $\Delta T$ obtained in the following Expression 1 becomes less than 2° C., are selected, an area ratio S is calculated by substituting x, y and z at this time into Expression 2, and x, y and z are set so that the calculated area ratio S can be 5% or less:

$$\Delta T=(-0.06y-0.773)x-0.24y+0.424z+1.522 \quad \text{(Expression 1)}$$

$$S=(0.082z+2.5839)\Delta T^2+(-1.6817z-0.0561)\Delta T+(1.4788z-1.6119) \quad \text{(Expression 2).}$$

* * * * *